United States Patent
Xie et al.

(10) Patent No.: US 9,989,566 B2
(45) Date of Patent: Jun. 5, 2018

(54) METHOD FOR DETECTING POWER INTERRUPTION DURATION OF AN ELECTRONIC DEVICE

(71) Applicants: METTLER TOLEDO (CHANGZHOU) PRECISION INSTRUMENT LTD., Changzhou (CN); METTLER TOLEDO (CHANGZHOU) MEASUREMENT TECHONOLOGY LTD., Changzhou (CN); METTLER TOLEDO (CHANGZHOU) SCALE & SYSTEM LTD., Changzhou (CN)

(72) Inventors: Guojun Xie, Changzhou (CN); Guangping Xia, Changzhou (CN); Jingquan Yu, Changzhou (CN)

(73) Assignees: METTLER TOLEDO (CHANGZHOU) PRECISION INSTRUMENT LTD., Changzhou, Jiangsu (CN); METTLER TOLEDO (CHANGZHOU) MEASUREMENT TECHNOLOGY LTD., Changzhou, Jiangsu (CN); METTLER TOLEDO (CHANGZHOU) SCALE & SYSTEM LTD., Changzhou, Jiangsu (CN)

( * ) Notice: Subject to any disclaimer, the term of this patent is extended or adjusted under 35 U.S.C. 154(b) by 830 days.

(21) Appl. No.: 14/523,306

(22) Filed: Oct. 24, 2014

(65) Prior Publication Data

US 2015/0106048 A1    Apr. 16, 2015

Related U.S. Application Data

(63) Continuation of application No. PCT/CN2013/074864, filed on Apr. 27, 2013.

(30) Foreign Application Priority Data

Apr. 27, 2012 (CN) .......................... 2012 1 0128272

(51) Int. Cl.
*G01K 17/00* (2006.01)
*G01R 21/00* (2006.01)
(Continued)

(52) U.S. Cl.
CPC ............. *G01R 21/00* (2013.01); *G01K 13/00* (2013.01); *G01R 19/15* (2013.01); *G04F 10/105* (2013.01)

(58) Field of Classification Search
CPC ........ G01R 21/00; G01R 19/15; G01K 13/00; G04F 10/105
(Continued)

(56) References Cited

U.S. PATENT DOCUMENTS 4,717,984 A * 1/1988 Henry .................... H02H 6/005
                                                    307/66
5,418,677 A * 5/1995 Engel ....................... G06J 1/00
                                                    361/25

(Continued)

FOREIGN PATENT DOCUMENTS

CN    101629845 A    1/2010
CN    102122146 A    7/2011
(Continued)

OTHER PUBLICATIONS

International Search Report (PCT/ISA/210) dated Aug. 8, 2013, by the Chinese Patent Office as the International Searching Authority for International Application No. PCT/CN2013/074864.
(Continued)

*Primary Examiner* — Stephanie Bloss
(74) *Attorney, Agent, or Firm* — Buchanan Ingersoll & Rooney PC (57) ABSTRACT

A method is disclosed for detecting power interruption duration of an electronic device. The method can include establishing a curve model of linearly synthesized values of temperature sensor readings versus time; after power-on, acquiring each of the initial temperature values by respective
(Continued)

temperature sensors mounted on the electronic device, and transmitting the temperature initial values to a microprocessor; calculating a linearly synthesized value of the temperature sensor readings of the electronic device according to a power-on duration for this time and a stored curve model, and storing the linearly synthesized value of the temperature sensor readings as a basis for calculating the power interruption duration thereafter. When the electronic device is powered on again after power interruption, a linearly synthesized value of the temperature sensor readings according to the power-on time for this time can be calculated, and used for calculating the power interruption duration thereafter.

7 Claims, 4 Drawing Sheets

(51) Int. Cl.
     *G01R 19/15* (2006.01)
     *G04F 10/10* (2006.01)
     *G01K 13/00* (2006.01)
(58) Field of Classification Search
     USPC .......................................................... 702/136
     See application file for complete search history.

(56) References Cited

U.S. PATENT DOCUMENTS

| 5,525,881 | A  | * | 6/1996 | Desrus ................ | H02H 6/005 |
|-----------|----|---|--------|----------------------|-----------|
|           |    |   |        |                      | 180/446   |
| 6,563,685 | B2 | * | 5/2003 | Gotzig ................ | H02P 29/60 |
|           |    |   |        |                      | 337/14    |
| 7,361,867 | B2 | * | 4/2008 | Von Steuben ........ | G01G 23/48 |
|           |    |   |        |                      | 219/494   |
| 7,555,366 | B2 | * | 6/2009 | Kuivalainen .......... | H02H 6/005 |
|           |    |   |        |                      | 361/24    |

FOREIGN PATENT DOCUMENTS

| CN | 102628907 A      |   | 8/2012  |            |
|----|------------------|---|---------|------------|
| CN | 101629845 A      |   | 10/2013 |            |
| JP | 5-035372 B2      |   | 5/1993  |            |
| WO | WO 2001/024340 A1| *| 4/2001  | H02H 6/005 |
| WO | WO 2013/159743 A |   | 10/2013 |            |

OTHER PUBLICATIONS

Jinxian Zhao et al., "Study on the Question of Time Record for PLC Service Interruption", Journal of Jixi University, Mar. 2001, vol. 1, No. 1, pp. 52, 53 and 55, ISSN 1672-6758 (with English Abstract).

* cited by examiner

METHOD FOR DETECTING POWER INTERRUPTION DURATION OF AN ELECTRONIC DEVICE

RELATED APPLICATION

This application claims priority as a continuation application under 35 U.S.C. § 120 to PCT/CN2013/074864, which was filed as an International Application on Apr. 27, 2013 designating the U.S., and which claims priority to Chinese Application 201210128272.0 filed in China on Apr. 27, 2012. The entire contents of these applications are hereby incorporated by reference in their entireties.

FIELD

The present disclosure relates to a method for detecting power interruption duration of an electronic device, and belongs to the technical field of detecting interruption duration of an electronic device.

BACKGROUND INFORMATION

A variety of electronic devices, such as electronic scales, electronic balances, digital sensors and automatic control devices, are used in various industries. These electronic devices can include a device carrier, printed circuit board, cables and so on. In use of some electronic devices, when the electronic devices are powered on, it is desirable to know any power interruption duration of the devices, for diagnosis of an initial state of the devices at power on and compensation for thermal deformation error, or for preheat compensation of the electronic devices during a period after power on. It can be much more important to record the power interruption duration of the electronic devices, such as in a situation where the devices are subjected to power interruption and power on frequently.

A known method of recording power interruption duration is to employ a RTC (Real Time Clock) to record the power interruption duration. There are two kinds of RTC: one is a battery-powered disposable RTC, and the other is a rechargeable RTC (or named "Super capacitor") which can be reused many times.

Aspects of a RTC (Real Time Clock) in recording power interruption duration include:

1) Complexity and cost of the circuit is increased, because an RTC involves coordination of external circuits;

2) When recording the power interruption duration, a RTC writes point-in-time data into a non-volatile memory continuously, which affects the capacity and read-write lifespan of the non-volatile memory; once the non-volatile memory does not work, the RTC would lose its timing function;

3) Performance of the electronic device can be affected due to high power consumption during recharging of the RTC;

4) Discharge time of the RTC can be limited, and when the RTC runs out of battery, it no longer has timing function; and 5) When an RTC works at a low voltage, timing thereof can be inaccurate, which is less reliable.

SUMMARY

A method is disclosed for detecting power interruption duration of an electronic device, comprising:

(1) establishing a curve model of linearly synthesized values of temperature sensor readings versus time, and storing the curve model for access by a microprocessor, wherein the curve model of a linearly synthesized values of temperature sensor readings versus time is represented as:

$$ST = \sum_{i=1}^{n} k_i \cdot [a_{0i} + a_{1i}(1 - 1/e^{(t/C_i)})]$$

in which: ST is a linearly synthesized value of temperature sensor readings; n is a number of the temperature sensors, n≥2; $k_i$ is a synthesized coefficient of the temperature value; and $k_i$ is controlled to be <0~−1, >0~1; $a_{0i}$ is an initial temperature value acquired by a temperature sensor; $a_{1i}$ is a scaling factor of a temperature sensor output, and $a_{1i}$ is controlled to be <0~−200, >0~200; $C_i$ is a time constant, and C is 1~10000; and t is a power-on duration or power-interruption duration (s), wherein the power-on duration is represented by $t_p$, and the power-interruption duration is represented by $t_o$;

(2) wherein the electronic device includes at least one temperature sensor for detecting temperature of the electronic device and at least one temperature sensor for detecting temperature of a printed circuit board;

(3) conveying, after power-on of the electronic device, each acquired initial temperature value $a_{0i}$ by a respective temperature sensor to a microprocessor through an analog-to-digital conversion module; processing each acquired initial temperature value $a_{0i}$ by the microprocessor to filter out an interfering signal, while recording a power-on duration $t_p$ for this time by the microprocessor; calculating a linearly synthesized value ST of the temperature sensor readings of the electronic device for this time with the stored curve model, and storing the linearly synthesized value ST of the temperature sensor readings within the microprocessor as a basis for calculating the power interruption duration $t_o$ thereafter; and (4) conveying, when the electronic device is powered on again after power interruption, each initial temperature value $a_{0i}$ reacquired by the temperature sensors to the microprocessor through the analog-to-digital conversion module; processing each acquired initial temperature value $a_{0i}$ by the microprocessor to filter out an interfering signal; reading by the microprocessor the linearly synthesized value ST of the temperature sensor readings stored at a last time; calculating the power interruption duration $t_o$ for this time with the curve model of the linearly synthesized value of temperature sensor readings versus time and storing the power interruption duration $t_o$ for this time, while recording the power-on duration $t_p$ for this time; calculating the linearly synthesized value ST of the temperature sensor readings of the electronic device for this time, and storing the linearly synthesized value ST of the temperature sensor readings within the microprocessor as a basis for calculating the power interruption duration $t_o$ again thereafter, wherein when the power interruption duration $t_o$ is greater than a specified value, the power interruption duration $t_o$ is designated as a critical value.

BRIEF DESCRIPTION OF THE DRAWINGS

Exemplary embodiments of the present invention disclosed herein will be described in further detail in conjunction with the accompanying drawings, wherein.

DETAILED DESCRIPTION

An exemplary method for detecting a power interruption duration of an electronic device that is not limited by discharge time, accurate in timing, and does not affect performance of the electronic device is disclosed.

Figure 1:
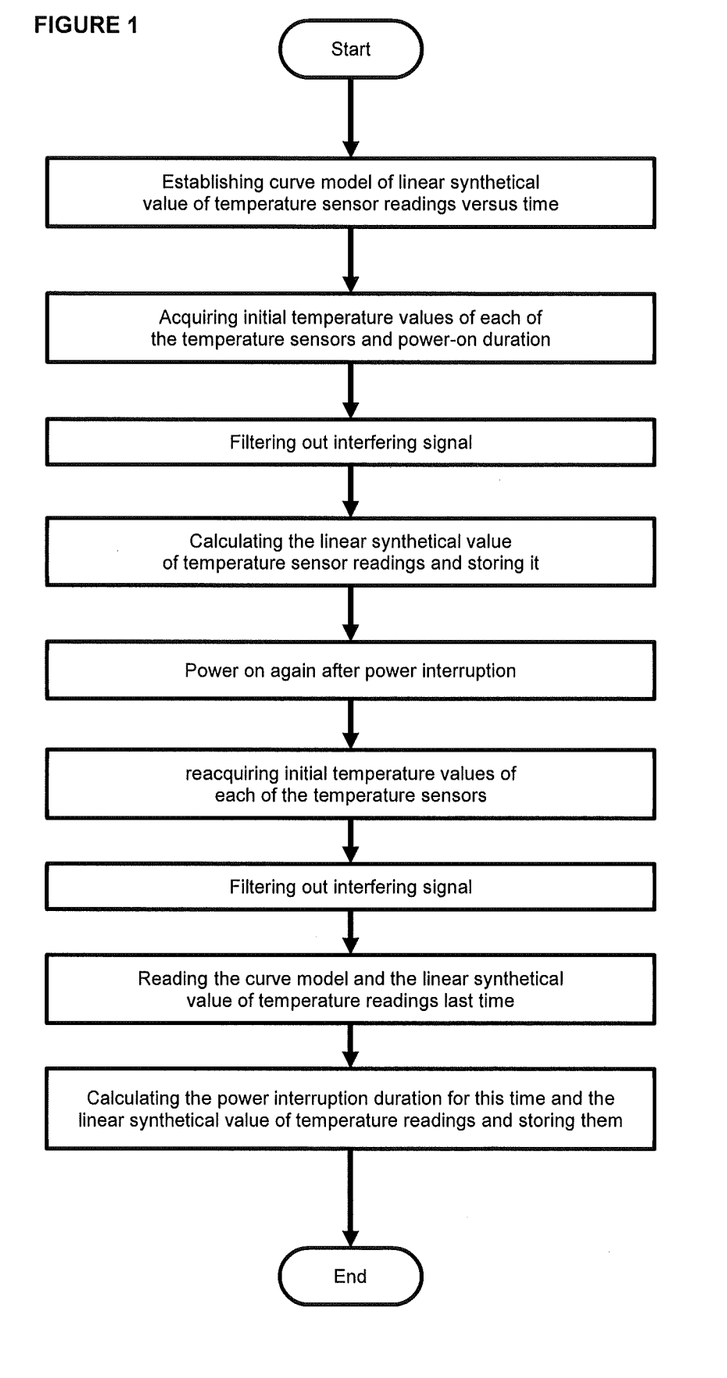
FIG. 1 is a flow diagram of an exemplary method of detecting a power interruption duration of electronic device according to the present disclosure.

As shown in FIG. 1, an exemplary method of detecting a power interruption duration of electronic device according to the present disclosure can include:

(1) establishing a curve model of synthesized values of temperature sensor readings versus time, and writing the curve model into a microprocessor as firmware, wherein the curve model of a synthesized values of temperature sensor readings versus time is represented as:

$$ST = \sum_{i=1}^{n} k_i \cdot [a_{0i} + a_{1i}(1 - 1/e^{(t/C_i)})]$$

in which:

ST is a linearly synthesized value of the temperature sensor readings;

n is a number of the temperature sensors, n≥2;

$k_i$ is a synthesized coefficient of a temperature value, and $k_i$ is controlled to be <0~−1, >0~1;

$a_{0i}$ is an initial temperature value acquired by a temperature sensor;

$a_{1i}$ is a scaling factor of a temperature sensor output, and $a_{1i}$ is controlled to be <0~−200, >0~200;

$C_i$ is a time constant, and C is 1~10000; and t is a power-on duration or power-interruption duration (s), wherein the curve model is represented as $$ST = \sum_{i=1}^{n} k_i \cdot [a_{0i} + a_{1i}(1 - 1/e^{(t_p/C_i)})]$$

for power-on duration represented by $t_p$, and the curve model is represented as $$ST = \sum_{i=1}^{n} k_i \cdot [a_{0i} + a_{1i}(1 - 1/e^{(t_o/C_i)})]$$

for power-interruption duration represented by $t_o$.

Figure 2:
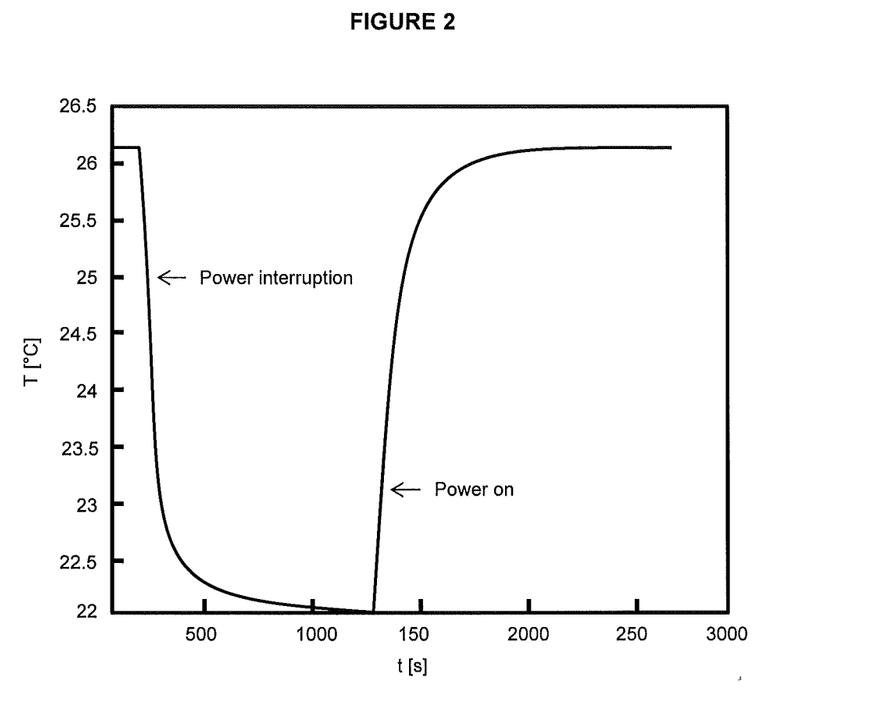
FIG. 2 is an exemplary graph showing synthesized values of temperature sensor readings versus time according to the present disclosure.

In the above exemplary representation, $k_i$, $a_{1i}$, and $C_i$ are all dependent on the temperature sensors. The number of the installed temperature sensors is not limited. As shown in FIG. 2, an exemplary graph of synthesized values of temperature sensor readings versus time according to an exemplary embodiment, applies to both a power-on situation and a power-interruption situation, such that the effort for calculation can be reduced.

(2) In an exemplary embodiment, the electronic device can include at least one temperature sensor for detecting temperature of the electronic device and at least one temperature sensor for detecting temperature of the printed circuit board, wherein the temperature sensors can be mounted at moving sites and heat-generating sites of the electronic device.

Figure 3:
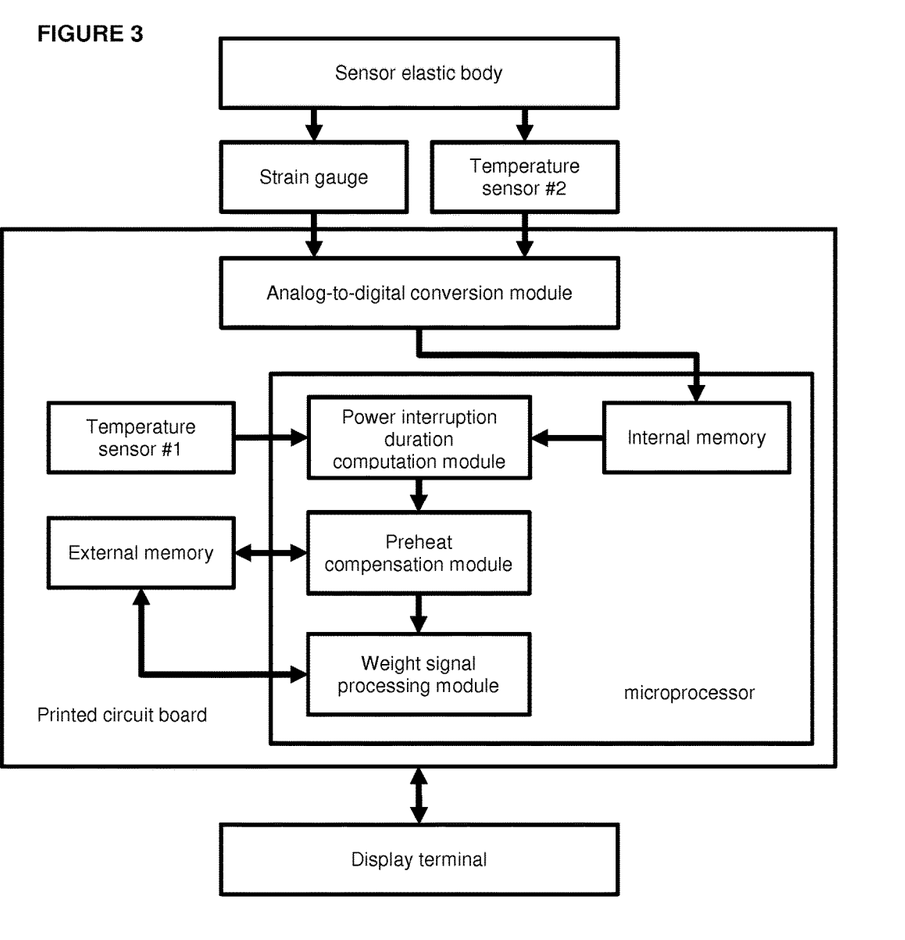
FIG. 3 is a schematic diagram showing an exemplary configuration of an electronic weighing device in which an exemplary method of detecting power interruption duration of electronic device according to the present disclosure is implemented.

As shown in FIG. 3, one temperature sensor can be mounted on a digital weighing sensor, and another temperature sensor can be mounted on the printed circuit board.

Figure 4:
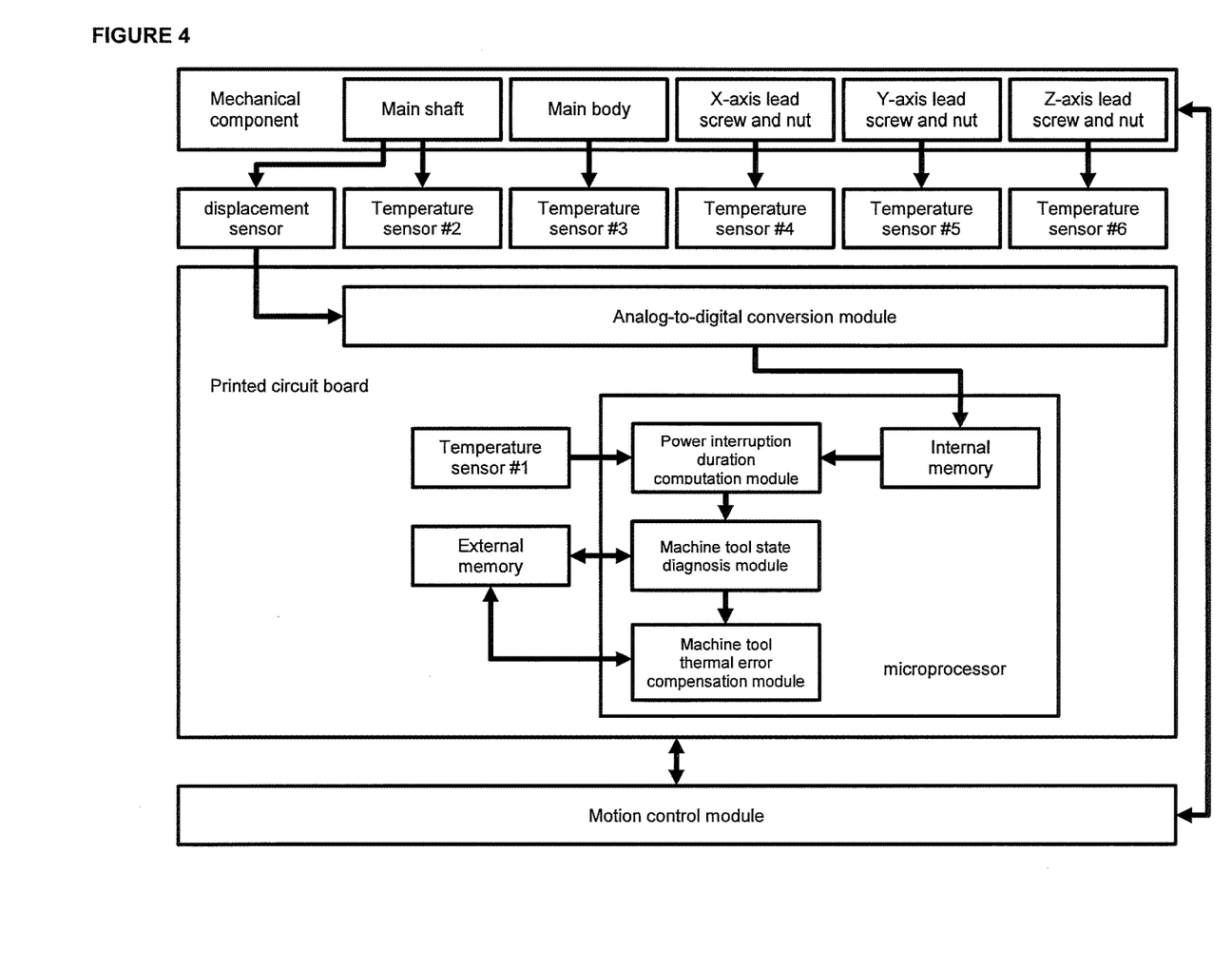
FIG. 4 is a schematic diagram showing an exemplary configuration of a numerically-controlled machine tool in which an exemplary method of detecting a power interruption duration of electronic device according to the present disclosure is implemented.

As shown in FIG. 4, the temperature sensors can be mounted on main shaft, main body, X-axis lead screw and nut, Y-axis lead screw and nut, Z-axis lead screw and nut of the machine tool, respectively, at sites which can reflect a temperature distribution of the device. These temperature sensors may be mounted internal or external to the electronic device, and may be disposed depending on the configuration of the electronic device.

(3) In an exemplary embodiment, the method can include: conveying, after power-on of the electronic device, each acquired initial temperature value $a_{0i}$ to a respective temperature sensor to a microprocessor through an analog-to-digital conversion module; processing each acquired initial temperature value $a_{0i}$ by the microprocessor to filter out an interfering signal, while recording a power-on duration $t_p$ for this time by the microprocessor; calculating a linearly synthesized value ST of the temperature sensor readings of the electronic device for this time with the stored curve model, and storing the linearly synthesized value ST of the temperature sensor readings within the microprocessor as a basis for calculating the power interruption duration $t_o$ thereafter.

(4) The method can include conveying, when the electronic device is powered on again after power interruption, each initial temperature value $a_{0i}$ reacquired by the temperature sensors to the microprocessor through the analog-to-digital conversion module; processing each acquired initial temperature value $a_{0i}$ by the microprocessor to filter out an interfering signal; reading by the microprocessor the linearly synthesized value ST of the temperature sensor readings stored at a last time; calculating the power interruption duration $t_o$ for this time with the curve model of the synthesized values of temperature sensor readings versus time and storing the power interruption duration $t_o$ for this time while recording the power-on duration $t_p$ for this time; calculating the linear synthesized value ST of the temperature sensor readings of the electronic device for this time, and storing the linearly synthesized value ST of the temperature sensor readings for this time within the microprocessor as a basis for calculating the power interruption duration $t_o$ again thereafter; repeating the above steps, such that the power interruption duration for each time can be calculated more precisely. When the power interruption duration $t_o$ is greater than a specified (e.g., critical) value, the power interruption duration $t_o$ is designated as a critical value, wherein the critical value of the power interruption duration $t_o$ is, for example, between 1.5 h to 9 h.

In an exemplary embodiment, the method can including writing the established curve model of the synthesized values of temperature sensor readings versus time into the microprocessor as firmware, detecting the initial temperature value at each measuring site of the electronic device by a respective temperature sensor after power-on of the electronic device, obtaining the linearly synthesized value ST of the temperature sensor readings of the electronic device for this time as a basis for calculating the power interruption duration $t_o$ thereafter, detecting the initial temperature value of the electronic device again by respective and temperature sensors after the electronic device is powered on again after power interruption, reading the linearly synthesized value ST of the temperature sensor readings stored at a last time and calculating the power interruption duration $t_o$ of the electronic device for this time. Since the temperature sensors can be directly connected to the printed circuit board without coordination of an external circuit, it can be simple to implement. Further, after the electronic device is powered on, the temperature sensors can function normally as long as the printed circuit board can function normally, which can provide excellent stability. In addition, when the electronic device is powered off, the temperature sensors can stop functioning, such that the temperature sensors can have longer lifetime and do not have a disadvantage of limited discharge time as with an RTC.

By reading the initial temperature value of the temperature sensors at power on, exemplary embodiments can calculate the power interruption duration $t_o$ for this time based on the linearly synthesized value ST of the temperature sensor readings of the electronic device stored at a last time. There is no need to write the data into the non-volatile memory continuously, which can save memory resources and bring high reliability. Exemplary embodiments need not involve the charging and discharging process of an RTC, which can bring low power consumption and affect the printed circuit board and overall performance of the electronic device. Exemplary embodiments can employ an established curve model of synthesized values of temperature sensor readings versus time, wherein the same curve model can be used for power-on duration $t_p$ and power interruption duration $t_o$, and a synthesized value of temperature sensor readings at a last time can be employed for calculating the power interruption duration for this time. Such a configuration can be less intensive in computation, less difficult in software implementation, involve less in system resource occupation and be easy to transplant.

FIG. 3 shows an electronic weighing device in which a method of detecting power interruption duration of an electronic device according to an exemplary embodiment disclosed herein is implemented. The electronic device can include a sensor elastic body, resistive strain gauge and printed circuit board, wherein the printed circuit board can include a microprocessor, analog-to-digital conversion module, external memory and other peripheral circuits. The resistive strain gauge can be connected with the sensor elastic body such that when weight is loaded on the sensor elastic body, deformation of the sensor elastic body will be transformed into an analog signal of voltage change of the resistive strain gauge. Such an analog signal is transmitted to the printed circuit board, and can be converted to a digital weight signal by the analog-to-digital conversion module therein.

The digital weight signal with noise can be transmitted to an internal memory within the microprocessor, then to a digital weight signal processing module for digital signal processing to form a stable and reliable weight signal. The final stable weight signal can be sent to the display terminal by the digital weighing sensor.

A method of detecting power interruption duration of an electronic device according to the present disclosure can be applied to a digital weighing sensor for preheat compensation of the digital signal. According to provisions of International Specification OIML-R60 and GB/T 7551-2008, there are specifications (i.e., requirements) of preheat duration and preheat parameters for a digital weighing sensor. In some applications, an electronic scale or balance is to be capable of weighing immediately after power-on. Thus, the digital weighing sensor should function normally after power-on, such that a preheat error of the sensor does not exceed a maximum tolerance. In such context, the digital weighing sensor is to be capable of preheat compensation.

An initial temperature value of the sensor elastic body is acquired by a temperature sensor No. 2 fixed on the sensor elastic body, and is converted by the analog-to-digital conversion module to a digital temperature signal, which is stored in an internal memory of the microprocessor. An initial temperature value of the printed circuit board is acquired by a temperature sensor No. 1 fixed on the printed circuit board proximate to the microprocessor, and is converted to a digital temperature signal, which is transmitted to a power interruption duration detection module of the microprocessor. With a disclosed method of detecting power interruption duration embedded into the power interruption duration detection module, when the digital weighing sensor is powered on, the power interruption duration detection module can read initial temperature values from both temperature sensors, and calculate power interruption duration of the digital weighing sensor based on the linear relationship of the numerical values of the two temperature sensors, and output the power interruption duration to a preheat compensation module.

Upon receiving the power interruption duration signal and digital weight signal, the preheat compensation module can perform preheat compensation on the weight signal to eliminate the impact of preheat on the digital weighing sensor. The compensated digital weight signal can be delivered to the weight signal processing module for temperature compensation, creep compensation, lag compensation or linear compensation, and becomes a weight signal with high precision. Such a weight signal can be sent to a display terminal which is an instrument, electronic scale or other display device.

After the digital weighing sensor is powered on, the power interruption detection module can operate to acquire an initial temperature value $a_{01}$ of the temperature sensor No. 1 on the printed circuit board and an initial temperature value $a_{02}$ of the temperature sensor No. 2 fixed on the sensor elastic body with an acquiring frequency of for example no less than the updating frequency of the digital weight signal, then filter out an interfering signal (such as a high frequency interfering signal), and normalize the temperature data for ease of floating point calculation. Upon recording the power-on duration $t_p$ by the microprocessor, the power interruption duration detection module 9 calculates a linearly synthesized value ST of the temperature sensor readings with the equation:

$$ST = \sum_{i=1}^{n} k_i \cdot [a_{0i} + a_{1i}(1 - 1/e^{(t/C_i)})]$$

Since two temperature sensors are employed, the linearly synthesized value of the temperature sensor readings is represented as $ST=k_1 \cdot [a_{01}+a_{11}(1-1/e^{(t/C_1)})]+k_2 \cdot [a_{02}+a_{12}(1-1/e^{(t/C_2)})]$. The linearly synthesized value ST of the temperature sensor readings is stored in an internal memory of the microprocessor, and is used as a basis for calculating the power interruption duration $t_o$ thereafter when powered on again.

When the weighing device is powered on again after power interruption, the power interruption detection module can operate to reacquire an initial temperature value $a_{02}$ of the temperature sensor No. 2 fixed on the sensor elastic body and an initial temperature value $a_{01}$ of the temperature sensor No. 1 on the printed circuit board, read the linearly synthesized value ST of the temperature sensor readings last stored in an internal memory of the microprocessor, synthesized coefficients $k_1$, $k_2$ of the temperature value of both temperature sensors, scaling factors $a_{11}$, $a_{12}$ of the temperature sensor output of both temperature sensors and time constants $C_1$, $C_2$ of both temperature sensors. With the values ST, $a_{0i}$, $a_{1i}$, $C_i$, $k_i$ determined, the power interruption duration $t_o$ of the electronic device for this time may be calculated by an iteration method, such as the Newton iteration method, using the same curve model of the synthesized values of temperature sensor readings versus time, and may be stored in external memory for preheat compensation. In the meantime, the microprocessor can record the power-on duration $t_p$ for this time, calculate the linearly synthesized value ST of the temperature sensor readings, and store it in the microprocessor as a basis for calculating the power interruption duration $t_o$ thereafter. Repeating the above steps, the power interruption duration for each time can be calculated more and more precisely. A specified critical value of the power interruption duration $t_o$ according to exemplary embodiments of the present disclosure can be between 1.5 h to 2.5 h. When the power interruption duration $t_o$ is greater than a critical value of 1.5 h, 2 h or 2.5 h, the power interruption duration $t_o$ is for example 1.5 h, 2 h or 2.5 h.

Exemplary methods of detecting power interruption duration of the present disclosure apply not only to a digital weighing sensor, but also to electronic devices or high-precision sensors that can require preheat compensation, such as an electronic scale, electronic balance, electronic flow sensor, infrared sensor and laser jet.

FIG. 4 shows a numerically-controlled machine tool in which an exemplary method of detecting power interruption duration of electronic device according to the present disclosure is implemented. The machine tool can include mechanical components, a printed circuit board and a motion control module. The mechanical components of the machine tool include the actuating component, which can include a main shaft, main body, X-axis lead screw and nut, Y-axis lead screw and nut, Z-axis lead screw and nut and cooling module. A printed circuit board used for thermal error compensation and troubleshooting can include a microprocessor, analog-to-digital conversion module, external memory and other peripheral circuits.

When the machine tool is powered on for operation, the printed circuit board determines whether the machine tool is in a normal state. If so, the numerically-controlled machine tool starts operation, and the motion control module receives the thermal error compensation signal from the printed circuit board and sends the compensated motion control to actuating components, to control motion of the main shaft and other mechanical components with precision for precise machinery operation, such as precise cutting.

A method of detecting power interruption duration of electronic device according to the present disclosure may be applied to the compensation for thermal deformation error (for short, "thermal error") in a numerically-controlled machine tool. Thermal error can be a key factor which affects stability of the machining precision of the machine tool, and can be a major error source for precision machine, such as numerically-controlled machine tool. Since a numerically-controlled machine tool generates heat inevitably in operation, such as in some high speed machining applications where the main shaft speed and feed speed are high, the thermal deformation of the machine tool structure and tracking error of the position control increase. Thus, thermal error compensation is desired for numerically-controlled machine tool, such as for a numerically-controlled machine tool with high precision.

After power on of the numerically-controlled machine tool, it may not work well until it has operated for a period of time. The period of time depends on the power interruption duration $t_o$ of the machine tool. Since the initial operation state of the machine tool also depends on the power interruption duration $t_o$ of the machine tool and the initial operation state has to be taken into account in thermal error compensation, the power interruption duration $t_o$ of the machine tool should be taken into account in thermal error compensation.

For example, temperature sensor No. 2 is fixed on a suitable position of the main shaft of the machine tool, for acquiring initial temperature values of the main shaft. Temperature sensor No. 3 is fixed on a suitable position of the main body of the machine tool, for acquiring initial temperature values of the main body. Temperature sensors No. 4, No. 5 and No. 6 are fixed on suitable positions on X, Y, Z lead screws and nuts of the machine tool, for acquiring initial temperature values of the X, Y, Z lead screws and nuts respectively. The initial temperature values acquired by these temperature sensors are converted to digital temperature signals by analog-to-digital conversion module and the digital temperature signals are stored in internal memory of the microprocessor. Temperature sensor No. 1 is fixed on the printed circuit board proximate to the microprocessor, for acquiring initial temperature values of the printed circuit board. The initial temperature values of the printed circuit board are converted to digital temperature signal and the digital temperature signal are transmitted to the power interruption duration detection module of the microprocessor.

Upon power-on of the numerically-controlled machine tool, the power interruption duration detection module reads simultaneously an initial temperature value of the temperature sensor No. 1 and initial temperature values of the temperature sensors No. 2-6 stored in the internal memory, then filters out an interfering signal (such as high frequency interfering signal), and normalizes the temperature data for ease of floating point calculation. Upon recording the power-on duration $t_p$ by the microprocessor, the power interruption duration detection module calculates the linearly synthesized value ST of the temperature sensor readings with the equation:

$$ST = \sum_{i=1}^{n} k_i \cdot [a_{0i} + a_{1i}(1 - 1/e^{(t/C_i)})],$$

wherein the number n of the temperature sensors is for example 6. The calculated linearly synthesized value ST of the temperature sensor readings is stored in an internal memory of the microprocessor, and is used as a basis for calculating the power interruption duration $t_o$ thereafter when powered on again.

When the weighing device is powered on again after power interruption, the power interruption detection module can operate to reacquire the initial temperature values of the temperature sensors No. 2-6 fixed on the machine tool and the initial temperature value of the temperature sensor No. 1 on the printed circuit board, read the linearly synthesized value ST of the temperature sensor readings last stored in internal memory of the microprocessor, synthesized coefficient $k_i$ of the temperature value of each of the temperature sensors, scaling factor $a_{1i}$ of the temperature sensor output of each of the temperature sensors, and time constant $C_i$ of each of the temperature sensors. With the values ST, $a_{0i}$, $a_{1i}$, $C_i$, $k_i$ determined, the power interruption duration $t_o$ of the machine tool for this time may be calculated by an iteration method, such as the Newton iteration method, using the same curve model of the synthesized values of temperature sensor readings versus time, and may be stored in external memory. The initial temperature values of each of the temperatures and the power interruption duration $t_o$ of the machine tool are output together to a machine tool state diagnosis module.

Upon receiving the initial temperature values of each of the temperatures, the deformation signal of the main shaft of the machine tool from a displacement sensor and the power interruption duration $t_o$ of the machine tool, the machine tool state diagnosis module reads diagnosis model and parameters in the external memory to diagnose an operation state of the numerically-controlled machine tool for this time and determine whether the machine tool is in a normal state. If not, precaution information can be given and the operation of the machine tool paused. If the state of the machine tool is determined as normal by the machine tool diagnosis module, the power interruption duration $t_o$, deformation of the machine tool and temperature information of each of the temperature sensors can be transmitted to the thermal error compensation module of the machine tool.

Subsequently, the thermal error compensation module of the machine tool reads compensation model and parameters stored in external memory, and calculates a thermal error compensation amount based on a power interruption duration of the machine tool, temperature information of each component, initial deformation of the machine tool and the like. The thermal error compensation amount can be sent to a numerical control system of the machine tool to eliminate the impact of thermal deformation on machining precision of the machine tool, thus achieving stability for the precision machining of the numerically-controlled machine tool.

In the meantime, the microprocessor can record the power-on duration $t_p$ for this time, calculate the linear synthesized value ST of the temperature sensor readings of the machine tool and store it in the microprocessor as a basis for calculating the power interruption duration $t_o$ thereafter.

Repeating the above steps, the power interruption duration for each time can be calculated more and more precisely. A specified critical value of the power interruption duration $t_o$ according to the present disclosure can be between 5 h to 9 h. When the power interruption duration $t_o$ is greater than a critical value of 6 h, 7 h or 8 h, the power interruption duration $t_o$ is for example 6h, 7 h or 8 h.

The present disclosure presents a method of calculating a power interruption duration $t_o$ of a numerically-controlled machine tool based on the relationship of several temperature sensors distributed at representative sites for measuring temperature in the machine tool, in order to realize thermal compensation. The method may be applied to not only a numerically-controlled machine tool, but also to all electronic-mechanical machining tools with high precision which involve thermal error compensation, such as CNC machining center, high-precision robotic arms.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method for detecting power interruption duration of an electronic device, which includes at least one first temperature sensor for detecting a temperature of the electronic device and at least one second temperature sensor for detecting a temperature of a printed circuit board, the method comprising:

(1) establishing a curve model of synthesized values of temperature sensor readings versus time;

(2) storing the curve model for access by a microprocessor of the electronic device;

(3) acquiring, at a first time after power-on of the electronic device, an initial temperature value from the at least one first temperature sensor and an initial temperature value from the at least one second temperature sensor, and conveying each initial temperature value respectively acquired by the at least one first and second temperature sensors at the first time to the microprocessor through an analog-to-digital conversion module;

(4) calculating a linearly synthesized value of the temperature sensor readings of the at least one first and second temperature sensors of the electronic device for the first time with the stored curve model established in step 1, and storing the synthesized value of the temperature sensor readings for the first time within the microprocessor as a basis for calculating a subsequent power interruption duration; and (5) acquiring, at a second time when the electronic device is powered on again after power interruption, an initial temperature value from the at least one first temperature sensor and an initial temperature value from the at least one second temperature sensor, and conveying each initial temperature value respectively acquired by the at least one first and second temperature sensors at the second time to the microprocessor through the analog-to-digital conversion module;

(6) calculating the power interruption duration for the second time with the curve model established in step 1 and based on the linearly synthesized value stored in the microprocessor as calculated in step 4, and storing the power interruption duration for the second time, while recording the power-on duration for the second time; and (7) calculating a linearly synthesized value of the temperature sensor readings of the at least one first and second temperature sensors of the electronic device for the second time, and storing the synthesized value of the temperature sensor readings within the microprocessor as a basis for calculating each subsequent power interruption duration of the electronic device to reduce computing operations of the microprocessor for each subsequent power interruption duration, wherein the curve model of synthesized values of temperature sensor readings versus time is represented as:

$$ST = \sum_{i=1}^{n} k_i \cdot [a_{0i} + a_{1i}(1 - 1/e^{(t/C_i)})]$$

where:

ST is a linearly synthesized value of temperature sensor readings;

n is a number of the temperature sensors, n≥2;

$k_i$ is a synthesized coefficient of the temperature value, where $k_i$ is controlled to be <0~−1, >0~1;

$a_{0i}$ is an initial temperature value acquired by the at least one first temperature sensor or the at least one second temperature sensor;

$a_{1i}$ is a scaling factor of a temperature sensor output, where $a_{1i}$ is controlled to be <0~−200, >0~200;

$C_j$ is a time constant, and C is 1~10000; and t is a power-on duration, wherein the power-on duration is represented by $t_p$, and the power-interruption duration is represented by $t_0$.

2. The method for detecting power interruption duration of an electronic device of claim 1, wherein the at least one first and second temperature sensors are mounted at at least one of moving sites and heat-generating sites of the electronic device.

3. The method for detecting power interruption duration of an electronic device of claim 2, wherein when the power interruption duration is greater than a specified value, the power interruption duration is designated as a critical value, and wherein the critical value of the power interruption duration is between 1.5 to 9 hours.

4. The method for detecting power interruption duration of an electronic device of claim 1, wherein when the power interruption duration is greater than a specified value, the power interruption duration is designated as a critical value, and wherein the critical value of the power interruption duration is between 1.5 to 9 hours.

5. The method of claim 1, comprising:

writing the curve model of the synthesized values of the temperature sensor readings versus time into the microprocessor as firmware.

6. The method of claim 1, wherein the at least one first and second temperature sensors are directly connected to the printed circuit board without coordination of an external circuit.

7. The method of claim 1, wherein when the electronic device is powered off, the at least one first and second temperature sensors stop functioning.

* * * * *